United States Patent [19]

Haberger et. al.

[11] Patent Number: 5,279,703
[45] Date of Patent: Jan. 18, 1994

[54] PROCESS FOR THE THIN ETCHING OF SUBSTRATES

[75] Inventors: Karl Haberger, Planegg; Reinhold Buchner, Unterföhring; Dieter Bollmann, Munich, all of Fed. Rep. of Germany

[73] Assignee: Fraunhofer Gesellschaft zur Forderung der Angewandten Forschung E.V., Munich, Fed. Rep. of Germany

[21] Appl. No.: 962,186
[22] PCT Filed: Jun. 27, 1991
[86] PCT No.: PCT/DE91/00535
§ 371 Date: Mar. 5, 1993
§ 102(e) Date: Mar. 5, 1993
[87] PCT Pub. No.: WO92/01309
PCT Pub. Date: Jan. 23, 1992

[30] Foreign Application Priority Data

Jul. 6, 1990 [DE] Fed. Rep. of Germany ....... 4021541

[51] Int. Cl.$^5$ ............ H01L 21/306; B04C 1/22; C03C 15/00; C03C 25/06
[52] U.S. Cl. ............ 56/635; 156/643; 156/657; 156/662; 156/646
[58] Field of Search ............ 156/628, 635, 643, 654, 156/657, 662, 646; 219/121.68, 121.69

[56] References Cited

U.S. PATENT DOCUMENTS

| | | | |
|---|---|---|---|
| 2,841,477 | 7/1958 | Hall | 156/646 |
| 3,830,665 | 8/1974 | Roman et al. | 156/7 |
| 4,518,456 | 5/1985 | Bjorkholm | 156/635 X |
| 4,678,536 | 7/1987 | Murayama et al. | 156/635 |
| 4,838,989 | 6/1989 | Ashby et al. | 156/635 X |
| 4,861,421 | 8/1989 | Bienstock | 156/635 |
| 5,057,184 | 10/1991 | Gupta | 156/654 |

FOREIGN PATENT DOCUMENTS

| | | |
|---|---|---|
| 2951938 | 12/1979 | Fed. Rep. of Germany . |
| 2-44728A | 2/1490 | Japan . |
| 2-44729A | 2/1990 | Japan . |
| 2-44730A | 2/1990 | Japan . |

OTHER PUBLICATIONS

Hodgson, R. T., "Method of Etching Undoped Regions of a Substrate Without Masking", IBM Tech. Discl. Bulletin, vol. 23, No. 3, Aug. 1980.

Li, Yu-Lin et al., "Molecular beam study of laser-induced chemical etching of Si(111) by chlorine molecules", Appl., Phys. Lett 53 (20), Nov. 14, 1988, pp. 1955-1957.

Tucker, A. W. et al., "Laser Chemical Etching of Vias in GaAs", IEEE Electron Device Letters, vol. EDL-4, No. 2, Feb. 1983.

von Gutfeld, R. J. et al., "Laser enhanced ething in KOH", IBM Thomas J. Watson Research Center, N.Y., accepted for pub. Nov. 23, 1981.

Harendt, Christine et al., "Silicon-on-Insulator Films Obtained by Etchback of Bonded Wafers", J. Electrochem. Soc., 136/11, Nov. 1989.

Haisma, Jan et al., "High-Quality SOI by Bonding of Standard SI Wafers and Thinning by Polishing Techniques Only", Japanese Journal of Applied Physics, vol. 28, No. 5, May 1989, pp. 725-726.

Bunkin, F. V. et al., "Si Etching Affected by IR Laser Irradiation", Applied Physics, A 37, 1985, pp. 117-119.

Haisma, J. et al, "Silicon-on-Insulator Wafer Bonding-Wafer Thinning Technological Evaluations", JP Journal of Applied Physics, vol. 28, No. 8, Aug. 1989, pp. 1426-1443.

Primary Examiner—William Powell
Attorney, Agent, or Firm—Wolf, Greenfield & Sacks

[57] ABSTRACT

In a process for the thin etching of substrates which are adapted to be etched by chemical etching agents, a predeterminable substrate layer thickness is obtained with an unaffected single-crystal grid structure of the substrate in that the substrate is irradiated during the etching process by means of a radiation source whose radiation impinges substantially perpendicularly to the substrate surface, the substrate consists of a radiation-absorbent material and the wavelength of the main component of the radiation is chosen such that the absorption length of the radiation of this wavelength in this substrate material is greater than the desired substrate layer thickness.

13 Claims, No Drawings

PROCESS FOR THE THIN ETCHING OF SUBSTRATES

DESCRIPTION

The present invention refers to a process for the thin etching of substrates which are adapted to be etched by chemical etching agents to an at least areawise uniform, predeterminable substrate layer thickness.

Quite generally, the present invention deals with a process for producing extremely thin substrates or extremely thin substrate layers having layer thicknesses in the order of less than one micrometer.

In the development and in the production of highly-integrated circuits, techniques for providing mutual lateral in a planar mode of arrangement on the semiconductor surface, have increasingly been used within the last few years for reducing the mutual distance between the individual components and for increasing thus the integration density of the integrated circuit. Typical insulation techniques for the mutual lateral insulation of semiconductor components within semiconductor circuits are known to the person skilled in the art under the names of LOCOS as well as trench etching technique.

The reason for the use of lateral insulation techniques is to be seen in the fact that electrically relevant processes in semiconductor circuits typically take place in a region of the semiconductor crystal which defines the uppermost layer region and which has a thickness of approx. 1 $\mu$m. For mechanical reasons, it is normally necessary that the semiconductor crystal must have a thickness of many hundred $\mu$m. Except for its mechanical carrier function, the thick semiconductor crystal material proves to be disadvantageous with respect to its electrical properties. In comparison with such thick semiconductor crystals, thin substrates have some technological advantages comprising, compared with thicker materials, a simpler lateral insulation by means of which a latch-up effect can be suppressed in the case of CMOS circuits, as well as the absence of extensive space charge regions.

For a prolonged period of time, attempts have been made to utilize the advantages of such thin substrates by means of various techniques, each of said techniques making use of a thin semiconductor layer or usable layer arranged above an insulation layer, which, in turn, is located on a carrier substrate.

One of these techniques is the so called SOS (silicon on sapphire) technique in the case of which a silicon layer is heteroepitactically grown onto a sapphire crystal. However, this technique can only be used for producing silicon layers having a poor crystal quality.

The SIMOX (silicon implanted oxygen) technique comprises the step of implanting high doses of oxygen in silicon, and, after a temperature step, said implanted oxygen will form a buried, insulating $SiO_2$ layer at a distance of approximately 0.2 $\mu$m below the semiconductor surface. This process for producing the buried, insulating layer will, however, cause crystal damage.

The techniques referred to hereinbefore also comprise the so called ZMR (zone melting recrystallization) technique. In the case of this technique an amorphous or microcrystalline silicon layer is first deposited on an oxidized wafer. By means of laser beams or electron beams, the amorphous silicon layer is remelted in its surface region so as to produce large crystal regions. This technique does, however, not offer the possibility of forming the whole recrystallized layer as a single crystal of high quality.

A promising method of producing the above-mentioned SOI substrates, in the case of which the semiconductor layer is located above an insulating layer, is the wafer bonding technique, since with the aid of this technique it is, in principle, possible to produce perfectly monocrystalline usable layers. This technique includes the step of combining the polished surfaces of two wafers under extremely dustfree conditions. Normally, one wafer or both wafers are provided with a silicon dioxide layer, which is produced by thermal oxidation or by deposition of an oxide layer. This oxide layer can also be doped, and it may, for example, include borosilicate glass, phosphorus silicate glass or boron phosporus silicate glass. Other insulating and chemically resistant materials may be used for the insulating layer as well.

It is also possible that one wafer or both wafers already include structures, which may even be as intricate as complete components. The surface of the wafer may be covered with an insulator, such as silicon dioxide, or it may have been smoothed by making use one of the planarization methods, which are known per se and which comprise the use of flow glasses and spin-on glasses as well as the measure of etching back.

The adhesion between the two wafer surfaces is first based on the formation of hydrogen bridges between adsorbed OH groups. During the subsequent heating of the wafers, Si-0-Si bonds will form at approx. 300° C., and, finally, a solid connection, which is not distinguishable from a grown oxide, will be formed at temperatures of approx. 1000° C. by a viscous flow of the oxide. After the thus performed bonding of the two wafers, the bonded wafers can be thinned on one side so that the thin SOI usable layer will remain in a condition in which it is inseparably bonded to the carrier wafer.

The main technological problem is, in this case, the thinning of the usable layer of the bonded wafer, since layer thicknesses of the usable layer of down to 0.1 $\mu$m are aimed at. The thinning is first carried out mechanically, by grinding, and, in the last thinning phase, it is carried out by a wet chemical treatment. The problem lies here in the uniformity of the thinning process, said uniformity determining, of course, the residual thickness of the usable layer which is, ultimately, the minimum thickness to be maintained.

For this purpose, the technical publication J. B. Lasky, S. R. Stiffler, F. R. White and J. R. Abernathy, IEDM Techn. Dipl. 684 (1985), suggests that a heavily-doped (boron-p+) layer should be implanted or incorporated by diffusion, said layer serving as an etch stop during the wet chemical etching carried out for thinning the usable layer, and a lightly-doped epitactical layer being additionally applied to the etch stop layer so as to obtain high-resistance usable layers. It is true that the implanted etch stop layer has a depth which is constant throughout the surface of the semiconductor and by means of which a constant thickness of the usable layer in the sub-micrometer region can be guaranteed, but the implantation of the etch stop layer and the epitaxy will cause crystal damage, or doping will occur due to autodoping. Furthermore, this technique requires a great deal of complicated production processes and, consequently, it will entail additional costs.

The technical publication T. Matsushita, H. Satoh, M. Shimanoe, A. Nieda, A. Ogasawara, M. Yamagishi, A. Yagi, 47th Annual Device Research Conference, June 1989, Cambridge Mass., discloses another process for defined, surface-homogeneous thinning of the usable layer. This process makes use of photolithographically produced, partially buried support grids of hard materials, such as $SiO_2$ or $Si_3N_4$, so as to guarantee a uniform layer thickness of the usable layer when mechanical grinding is carried out. By means of this process, SOI layers were obtained, which have a layer thickness of 80 nm ±20 nm throughout the layer thickness of a 5-inch wafer. Due to the support grid, it is, however, not possible to obtain a perfectly monocrystalline semiconductor usable layer throughout the whole area of the wafer.

The technical publication A. Yamada, B. L. Jian, H. Shirotori, O. Okabayaski, T. Iizuka, G. A. Rozgonyi, Electrochemical Society Spring Meeting, Vol. 90, page 458, discloses that the thinning of the usable layer is carried out by electrochemical and numerically controlled polishing. Due to the complexity of the apparatuses required, this process is hardly suitable for being used in practice.

It is known that the layer thickness of a layer to be etched may be supervised by light during the etching process, said etching process being finished as soon as the layer to be etched is transparent to the supervising light.

JP 2-44728 A2 (Abstract) discloses that, for increasing the etching rate of an insulating film on a metal layer, the structure consisting of said insulating film and said metal layer is exposed to infrared radiation. The infrared radiation is reflected by metal layer regions. The reflected radiation is subjected to stronger absorption within the insulating film above the metal layer regions than outside of said metal layer regions so that there will be a higher etching rate of the insulating film above the metal layer regions. This technique serves exclusively the purpose of increasing the etching rate for etching away insulating areas above a metal layer region in comparison with the etching rate of insulating areas which are not located above metal layer regions so as to cause thus an increased removal of raised portions of the insulating layer above the metal layer regions This is intended to result in a reduction of the topographical steps, which the insulating film has due to the metal layer regions located below said film. Hence, this publication does not deal with the problem of producing areawise uniform, predeterminable substrate layer thicknesses.

The technical publication IBM TDB, vol. 23, No. 3, August 1980, pages 1260 and 1261, discloses an etching process for maskfree etching of undoped regions of a substrate. This process makes use of the increased absorption of laser light either in doped or in undoped regions of a semiconductor substrate during the etching process for increasing thus the etching rate within the respective region of increased absorption. The production of unaffected layers having, at least areawise, a uniform, predeterminable layer thickness is not dealt with in this publication.

Taking this prior art as a basis, it is an object of the present invention to provide a process for the thin etching of substrates, which are adapted to be etched by chemical etching agents, to an, at least areawise, uniform, predeterminable layer thickness, said process requiring only little expenditure and avoiding, in addition, faults within the substrate layer.

The present invention is based on the finding that, in the case of substrates consisting of materials absorbing the radiation used, irradiation of the substrate during the etching process by means of a radiation source whose radiation impinges substantially perpendicularly to the substrate surface will result in a degree of heating of the substrate layer which depends on the instantaneous residual layer thickness related to the absorption length of the radiation. In view of the fact that, in the case of practically all types of chemical etching, the etching rate is strongly temperature dependent, the etching rate achieved will depend on the degree of heating of the substrate layer thickness, said degree of heating depending on the layer thickness. As soon as the residual substrate layer thickness becomes smaller than the absorption length of the radiation having the used wavelength in the substrate material, the heating caused by the radiation will decrease, since the absorbed percentage of radiation will decrease. By varying the wavelength of the used radiation in the case of a single-frequency radiation or monochromatic light or by varying the main spectrum of the used radiation, e.g. in the case of a radiation source having a broad radiation spectrum, it will be possible to adjust the absorption length of the radiation in the substrate material. The term absorption length is used for the penetration depth within which the residual radiation has decreased, in relation to the entering radiation, by a factor of 1 divided by e. The absorption length is chosen such that it exceeds the desired substrate layer thickness. It follows that, by choosing the radiation, an essentially free adjustment of the obtainable substrate layer thickness will be possible.

In the following, a preferred embodiment of the process according to the present invention will be explained in detail. In the case of the preferred process according to the present invention, a wafer-bonding-SOI substrate is first produced in a manner which is known per se in the prior art and which has already been explained hereinbefore. Said preferred embodiment includes the step of providing two silicon wafers at their surfaces with a silicon dioxide layer by thermal oxidation. After polishing of the wafer surfaces, said wafers have their polished surfaces fitted together under extremely dustfree conditions. Subsequently, the combined wafers are heated to temperatures between approx. 300° C. and approx. 1000 ° C. At temperatures of approx. 300° C., Si-0-Si bonds will form, whereas, when heating to temperatures of approx. 1000° C. is carried out, a viscous flow of the oxide will result in a solid connection, which is not distinguishable from a grown oxide.

The silicon layer of the usable wafer is now mechanically thinned to a residual thickness of from 10 to 20 μm by means of mechanical processes which are known per se. The mechanical thinning can be carried out, e.g., by grinding.

This first thinning process can also be carried out by wet chemical etching. It is also imaginable that, in the case of suitably thin usable wafers, such a first thinning process is completely dispensed with.

The wafer-bonding substrate is now placed onto a suction holding device and secured in position relative thereto, e.g., with the aid of a vacuum, so that a good thermal contact will be established. The suction holding device is introduced in an etching bath together with the substrate. Said etching bath can, for example, be a diluted caustic potash solution.

By means of a radiation source, radiation is introduced into this etching bath in such a way that it will impinge substantially perpendicularly to the substrate surface of the usable wafer. In the sense of the terminology used in the present application, the term "substantially perpendicularly" is to be interpreted such that the radiation impinges on the substrate surface at such an angle that it will penetrate into said substrate surface. Normally, it will be endeavoured to make the radiation impinge perpendicularly to the surface of the usable wafer.

In the case of the preferred embodiment described by way of example, the radiation source is an argon laser emitting light with a power density of approx. 100 W/cm$^2$.

The monochromatic light emitted by an argon laser lies in the visible region and has a wavelength corresponding to the colour green.

Instead of a monochromatic light, it will also be possible to use a light or some other electromagnetic radiation having a distributed frequency spectrum.

The wavelength of the main component of the radiation is chosen such that the absorption length of the radiation of this wavelength in the substrate material, which is silicon in the case of the present embodiment, is greater than the desired substrate layer thickness.

In view of the fact that the desired layer thickness of the usable layer is 0.2 μm in the case of the preferred embodiment, the argon laser having a wavelength of $\gamma = 0.512$ μm was chosen as a radiation source, since light of this wavelength has an absorption length of approx. 0.3-0.5 μm in silicon.

As long as the thickness of the usable layer of the irradiated wafer-bonding-SOI substrate is greater than approx. 0.3 μm, the absorbed light will result in an increase of the temperature of the usable layer whose temperature will rise, in comparison with that of the bonding oxide, approximately proportionally to the absorbed power and approximately proportionally to the oxide thickness as well as approximately inversely proportionally to the thermal conductivity of the oxide. The thermal conductivity of silicon dioxide is smaller by approximately a factor of 10 than that of silicon at room temperature.

The resultant rise in temperature of the SOI usable layer wavelength and the radiation power density, the composition of the etching agent and the basic temperature.

When local light sources or point light sources are used, the process according to the present invention permits an irradiation of different areas of the wafer with different wavelengths and power densities, whereby areas of different thicknesses can be produced, the respective thickness being, however, constant throughout the individual area.

Hence, the process according to the present invention permits the production of semiconductor structures with usable layer areas of different thicknesses, and the respective thickness can be adapted in the best possible manner to the respective intended use of the usable layer. This will be particularly important, e.g., in the case of integrated circuits comprising, on the one hand, high-voltage components, which necessitate thick substrate dimensions, and, on the other hand, control logic units for which thin substrate dimensions will be sufficient. The process according to the present invention can, for example, also be used in the case of integrated sensors or micromechanical structural elements comprising logic circuits or amplifier circuits and e.g. thin, unsupported semiconductor diaphragms.

Deviating from the above-described preferred example, the process according to the present invention can also be used for thinning bonding wafers whose carrier substrate consists, e.g., of a material, which is transparent at the wavelength of the visible light, such materials being, e.g., quartz glass or sapphire. Quite generally, the carrier substrate can consist of a material which does not absorb the radiation or which absorbs said radiation only to a minor extent. This structural design of the carrier will result in a particularly low power consumption by said carrier, and this will cause a desired increase in the temperature differences between the areas of still different thicknesses of the usable layer which are to be etched so that an improved continuity of the obtainable usable layer thickness will be achieved.

Deviating still further from the example described hereinbefore, the process according to the present invention can also be used in the case of other semiconductor materials, metals and dielectric layers, provided that the material to be etched absorbs radiations over a specific absorption length.

Instead of the argon laser used in the case of the preferred embodiment, a pulsed radiation source can serve as a light source, said pulsed radiation source being, for example, a flashlight lamp. A thermal radiation source, which may optionally be provided with filters, can be used as a light source as well. Only by way of example, a filament lamp or a gas-discharge lamp is mentioned in this connection. It is also possible to use a flashlight lamp, which causes dynamic rises in temperature.

For adjusting the etching rate, the composition of the etching agent can also be varied within the process. Instead of the liquid etching solution used in the case of the preferred embodiment, it is just as well possible to use an etching gas or an etching gas mixture.

In order to make the etching process even more uniform, the radiation source can be moved relative to the substrate to be etched. Although it will be sufficient to choose the wavelength of the radiation source such that the absorption length of this radiation within the material to be etched is greater than the layer thickness to be obtained, a particularly simple adjustment of the layer thickness and a particularly stable etch stop will be achieved, if the absorption length of the radiation having the wavelength chosen is greater than the desired layer thickness by a factor of 3 to 8.

Instead of the argon laser used in the case of the preferred embodiment, a pulsed radiation source can serve as a light source, said pulsed radiation source being, for example, a flashlight lamp. A thermal radiation source, which may optionally be provided with filters, can be used as a light source as well. Only by way of example, a filament lamp or a gas-discharge lamp is mentioned in this connection. It is also possible to use a flashlight lamp, which causes dynamic rises in temperature.

For adjusting the etching rate, the composition of the etching agent can also be varied within the process. Instead of the liquid etching solution used in the case of the preferred embodiment, it is just as well possible to use an etching gas or an etching gas mixture.

In order to make the etching process even more uniform, the radiation source can be moved relative to the substrate to be etched. Although it will be sufficient to choose the wavelength of the radiation source such that the absorption length of this radiation within the material to be etched is greater than the layer thickness to be obtained, a particularly simple adjustment of the layer thickness and a particularly stable etch stop will be achieved, if the absorption length of the radiation having the wavelength chosen is greater than the desired layer thickness by a factor of 3 to 8.

We claim:

1. A process for the thin-etching to a desired substrate layer thickness of substrates that are etched by contact with chemical etching agents, comprising the steps of:
   selecting a substrate consisting of a radiation-absorbent material;
   selecting a radiation source that emits radiation having an absorption length in the radiation-absorbent substrate greater than the desired substrate layer thickness; and
   irradiating the substrate with the emitted radiation from the radiation source, wherein the emitted radiation impinges on the substrate at an angle substantially perpendicularly to a surface of the substrate.

2. A process according to claim 1, wherein the radiation-absorbent substrate is part of a wafer-bonding-SOI substrate, which wafer-bonding-SOI substrate comprises a carrier layer, an insulating layer arranged on said carrier layer, and a usable layer arranged on said insulating layer; and the radiation-absorbent substrate is the usable layer.

3. A process according to claim 2, wherein the carrier layer comprises a semiconductor material.

4. A process according to claim 2, wherein the carrier layer comprises a material which substantially does not absorb the emitted radiation.

5. A process according to claim 4, wherein the carrier layer comprises a material which is transparent in the visible wavelength region.

6. A process according to claim 5, wherein the carrier layer comprises quartz glass.

7. A process according to claim 1, wherein the absorption length of the emitted radiation in the radiation-absorbent substrate is between three and eight times the desired substrate layer thickness.

8. A process according to claim 1, wherein the emitted radiation is monochromatic light.

9. A process according to claim 1, wherein the emitted radiation is a thermal, non-monochromatic radiation.

10. A process according to claim 1, wherein the irradiating step comprises irradiating different areas of the substrate with radiations of different wavelengths.

11. A process according to claim 1, wherein the irradiating step comprises irradiating different areas of the substrate with radiations of different power densities.

12. A process according to claim 1, wherein the irradiating step comprises irradiating different areas of the substrate sequentially with radiations of different wavelengths and each area is irradiated with radiation of one wavelength.

13. A process according to claim 1, wherein the chemical etching agent is selected from the group consisting of a liquid and a gas.

* * * * *